US009520842B2

(12) United States Patent
Lee et al.

(10) Patent No.: US 9,520,842 B2
(45) Date of Patent: Dec. 13, 2016

(54) TRANSMISSION LINE DRIVER CIRCUIT FOR ADAPTIVELY CALIBRATING IMPEDANCE MATCHING

(71) Applicant: Realtek Semiconductor Corp., Hsinchu (TW)

(72) Inventors: Chao-Cheng Lee, Hsin-Chu (TW); Jian-Ru Lin, Nantou County (TW); Chien-Ming Wu, Hsinchu County (TW); Shih-Wei Wang, Hualien County (TW)

(73) Assignee: REALTEK SEMICONDUCOR CORP., Hsinchu (TW)

( * ) Notice: Subject to any disclaimer, the term of this patent is extended or adjusted under 35 U.S.C. 154(b) by 0 days.

(21) Appl. No.: 14/842,285

(22) Filed: Sep. 1, 2015

(65) Prior Publication Data
US 2016/0099689 A1   Apr. 7, 2016

(30) Foreign Application Priority Data
Oct. 1, 2014 (TW) .............................. 103134154 A

(51) Int. Cl.
| H03H 7/38 | (2006.01) |
| H03F 1/56 | (2006.01) |
| H03H 7/40 | (2006.01) |
| H03F 3/45 | (2006.01) |

(52) U.S. Cl.
CPC ............ *H03F 1/56* (2013.01); *H03F 3/45475* (2013.01); *H03H 7/40* (2013.01); *H03F 2200/114* (2013.01); *H03F 2200/387* (2013.01); *H03F 2203/45008* (2013.01); *H03F 2203/45022* (2013.01); *H03F 2203/45686* (2013.01)

(58) Field of Classification Search
CPC .................................... H03H 7/38; H03H 7/40
USPC .................................................... 333/17.3, 32
See application file for complete search history.

(56) References Cited

U.S. PATENT DOCUMENTS

| 7,451,356 B2 | 11/2008 | Yen et al. |
| 7,893,720 B2 | 2/2011 | Yadav et al. |
| 2016/0094196 A1* | 3/2016 | Lee .......................... H03F 3/45 333/2 |

* cited by examiner

*Primary Examiner* — Stephen E Jones
(74) *Attorney, Agent, or Firm* — Birch, Stewart, Kolasch & Birch, LLP

(57) ABSTRACT

A transmission line driver circuit includes: a transmission line driving amplifier having a first transmission terminal and a second transmission terminal; a first signal node; a second signal node; a first adjustable resistor positioned between the first transmission terminal and the first signal node; a second adjustable resistor positioned between the second transmission terminal and the second signal node; an internal node; a first divider resistor positioned between the first signal node and the internal node; a second divider resistor positioned between the second signal node and the internal node; a comparing circuit for comparing a divided voltage at the internal node with a reference voltage to generate a comparison signal; and an adjusting circuit for adjusting resistance of at least one of the first and second adjustable resistors according to the comparison signal.

8 Claims, 1 Drawing Sheet

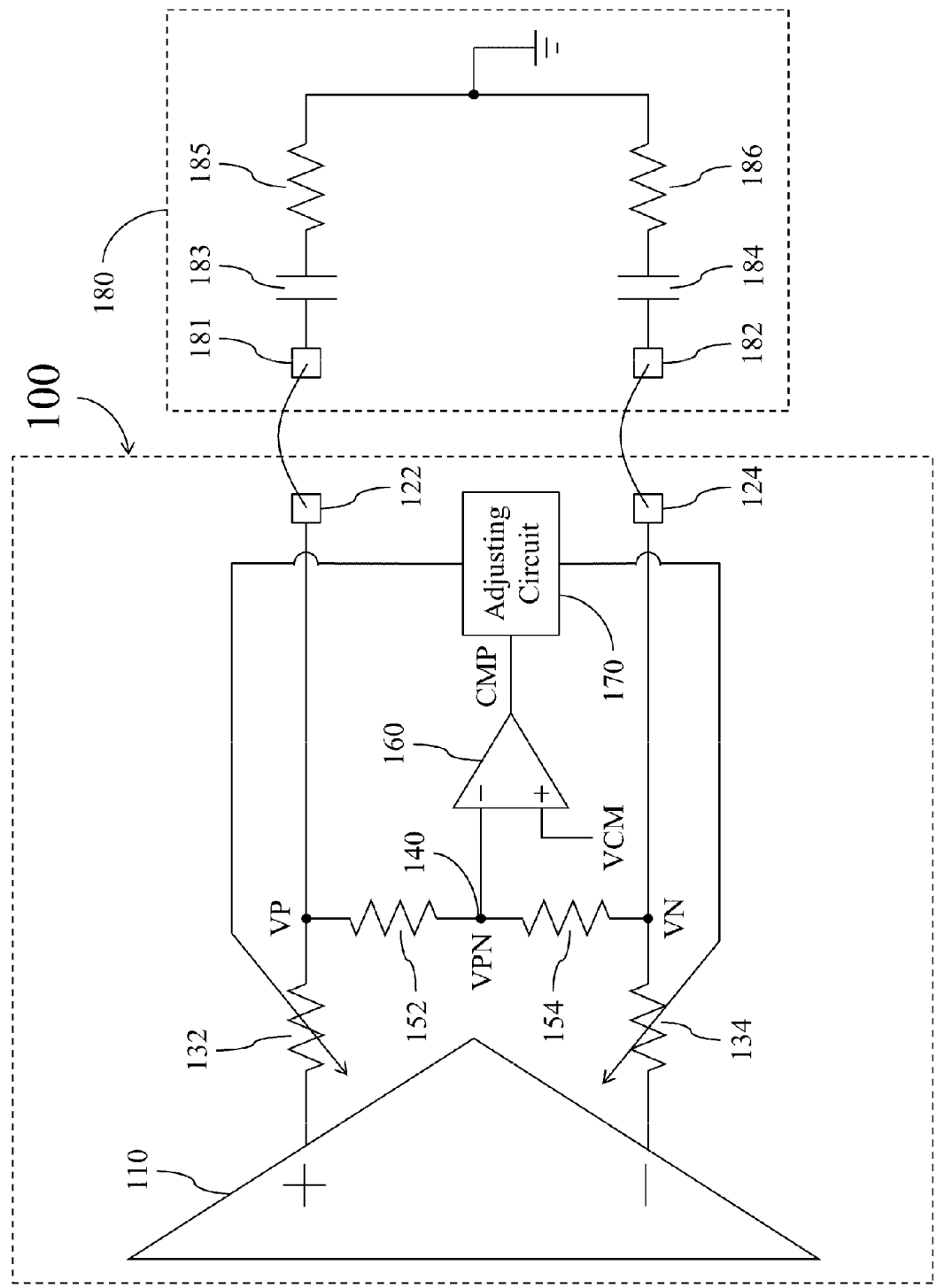

TRANSMISSION LINE DRIVER CIRCUIT FOR ADAPTIVELY CALIBRATING IMPEDANCE MATCHING

CROSS-REFERENCE TO RELATED APPLICATIONS

This application claims the benefit of priority to Patent Application No. 103134154, filed in Taiwan on Oct. 01, 2014; the entirety of which is incorporated herein by reference for all purposes.

BACKGROUND

The disclosure generally relates to a transmission line driver circuit and, more particularly, to a transmission line driver circuit for adaptively calibrating impedance matching.

In the ideal situation, an output circuit and an input circuit should operate under an impedance matching condition to efficiently deliver signals and energy. That is, the internal resistance of the output circuit should be identical to the input resistance of the output circuit, and the output impedance of the output circuit should be identical to the impedance of the input circuit (also refers to the load). A maximum transmission power can be achieved when the output circuit and the input circuit reach the impedance matching condition. On the contrary, if the output circuit and the input circuit cannot reach the impedance matching condition, it is impossible to maximize the transmission power and may also damage the circuits.

For example, when impedance mismatching occurs between the output circuit and the input circuit, it often results in asymmetry in the differential output currents of the output circuit, thereby causing EMI (electromagnetic interference) problems. In addition, the return loss is also increased when impedance mismatching occurs between the output circuit and the input circuit.

SUMMARY

An example embodiment of a transmission line driver circuit for adaptively calibrating impedance matching is disclosed, comprising: a transmission line driving amplifier comprising a first transmission terminal and a second transmission terminal for providing a pair of differential transmission signals; a first signal node for coupling with a first load-end signal node of an equivalent load circuit; a second signal node for coupling with a second load-end signal node of the equivalent load circuit; a first adjustable resistor positioned on a signal path between the first transmission terminal and the first signal node; a second adjustable resistor positioned on a signal path between the second transmission terminal and the second signal node; an internal node; a first divider resistor, wherein a first terminal of the first divider resistor is coupled with a signal path between the first adjustable resistor and the first signal node, and a second terminal of the first divider resistor is coupled with the internal node; a second divider resistor, wherein a first terminal of the second divider resistor is coupled with a signal path between the second adjustable resistor and the second signal node, and a second terminal of the second divider resistor is coupled with the internal node; a comparing circuit, coupled with the internal node, configured to operably compare a reference voltage with a divided voltage at the internal node to generate a comparison signal; and an adjusting circuit, coupled with the first adjustable resistor, the second adjustable resistor, and the comparing circuit, configured to operably adjust resistance of at least one of the first adjustable resistor and the second adjustable resistor according to the comparison signal.

Both the foregoing general description and the following detailed description are examples and explanatory only, and are not restrictive of the invention as claimed.

BRIEF DESCRIPTION OF THE DRAWINGS

FIG. 1 shows a simplified functional block diagram of a transmission line driver circuit according to one embodiment of the present disclosure.

DETAILED DESCRIPTION

Reference is made in detail to embodiments of the invention, which are illustrated in the accompanying drawings. The same reference numbers may be used throughout the drawings to refer to the same or like parts, components, or operations.

FIG. 1 shows a simplified functional block diagram of a transmission line driver circuit 100 according to one embodiment of the present disclosure. As shown in FIG. 1, the transmission line driver circuit 100 comprises a transmission line driving amplifier 110, a first signal node 122, a second signal node 124, a first adjustable resistor 132, a second adjustable resistor 134, an internal node 140, a first divider resistor 152, a second divider resistor 154, a comparing circuit 160, and an adjusting circuit 170.

The transmission line driving amplifier 110 comprises a first transmission terminal and a second transmission terminal for providing a pair of differential transmission signals. In this embodiment, the first transmission terminal is the non-invert output (+) terminal of the transmission line driving amplifier 110 while the second transmission terminal is the invert output (−) terminal of the transmission line driving amplifier 110. The first signal node 122 is utilized for coupling with a first load-end signal node 181 of an equivalent load circuit 180. The second signal node 124 is utilized for coupling with a second load-end signal node 182 of the equivalent load circuit 180. In practice, the first signal node 122 and the second signal node 124 may be respectively coupled with the first load-end signal node 181 and the second load-end signal node 182 through various paired signal carrying lines. In operations, the first signal node 122 and the second signal node 124 respectively transmit the differential transmission signals generated by the transmission line driving amplifier 110 to the first load-end signal node 181 and the second load-end signal node 182 of the equivalent load circuit 180.

The term "equivalent load circuit" as used throughout the description and the claims refers to various input circuits, such as an amplifier, a circuit to be inspected, an antenna, a receiving circuit, etc. For simplicity of illustration, the functional blocks of the equivalent load circuit 180 are simplified in FIG. 1. In the equivalent load circuit 180, the load-end equivalent capacitor 183 is utilized to represent an equivalent capacitor of the signal path on which the first load-end signal node 181 resides, and the load-end equivalent impedance 185 is utilized to represent an equivalent impedance of the signal path on which the first load-end signal node 181 resides. Similarly, the load-end equivalent capacitor 184 is utilized to represent an equivalent capacitor of the signal path on which the second load-end signal node 182 resides, and the load-end equivalent impedance 186 is utilized to represent an equivalent impedance of the signal path on which the second load-end signal node 182 resides.

In addition, the aforementioned first signal node 122 and second signal node 124 may be a pair of differential signal nodes of a medium dependent interface (MDI), a pair of differential signal node of a medium dependent interface crossover (MDIX), or a pair of differential signal nodes of other signal transmission interface. Similarly, the aforementioned first load-end signal node 181 and second load-end signal node 182 may be a pair of differential signal nodes of a MDI, a pair of differential signal node of a MDIX, or a pair of differential signal nodes of other signal transmission interface.

In this embodiment, a first terminal of the first adjustable resistor 132 is coupled with the first transmission terminal of the transmission line driving amplifier 110, and a second terminal of the first adjustable resistor 132 is coupled with the first signal node 122. A first terminal of the second adjustable resistor 134 is coupled with the second transmission terminal of the transmission line driving amplifier 110, and a second terminal of the second adjustable resistor 134 is coupled with the second signal node 124. A first terminal of the first divider resistor 152 is coupled with the signal path between the first adjustable resistor 132 and the first signal node 122, and a second terminal of the first divider resistor 152 is coupled with the internal node 140. A first terminal of the second divider resistor 154 is coupled with the signal path between the second adjustable resistor 134 and the second signal node 124, and a second terminal of the second divider resistor 154 is coupled with the internal node 140.

In other words, in the transmission line driver circuit 100, the first adjustable resistor 132 is positioned on the signal path between the first transmission terminal and the first signal node 122, the second adjustable resistor 134 is positioned on the signal path between the second transmission terminal and the second signal node 124, the first divider resistor 152 is positioned on the signal path between the first signal node 122 and the internal node 140, and the second divider resistor 154 is positioned on the signal path between the first signal node 122 and the internal node 140. In operations, the internal node 140 provides a divided voltage VPN, and the value of the divided voltage VPN is determined by the ratio of the resistance of the first divider resistor 152 to the resistance of the second divider resistor 154.

The comparing circuit 160 is coupled with the internal node 140 and configured to operably compare a reference voltage VCM with the divided voltage VPN at the internal node 140 to generate a comparison signal CMP. In this embodiment, the non-invert input (+) terminal of the comparing circuit 160 is coupled with a reference voltage VCM, and the invert input (−) terminal of the comparing circuit 160 is coupled with the internal node 140.

In practice, the comparing circuit 160 may be realized with a hysteresis comparator, and the reference voltage VCM coupled with the non-invert input (+) terminal of the comparing circuit 160 may be a common mode voltage provided by the transmission line driving amplifier 110.

The adjusting circuit 170 is coupled with the first adjustable resistor 132, the second adjustable resistor 134, and the comparing circuit 160. The adjusting circuit 170 is configured to operably adjust the resistance of at least one of the first adjustable resistor 132 and the second adjustable resistor 134 according to the comparison signal CMP.

In practice, the adjusting circuit 170 may be realized with various logic circuits, digital circuits, counters, or a combination of the above circuits. In some embodiments, the adjusting circuit 170 may further comprise a storage circuit (not shown) for storing data, and the storage circuit may be registers, buffers, flip-flops, memories, etc.

In the ideal situation, when the transmission line driver circuit 100 and the equivalent load circuit 180 reach the impedance matching condition, the absolute value of the voltage difference between the voltages VP and VPN at the two terminals of the first divider resistor 152 should be identical to the absolute value of the voltage difference between the voltages VN and VPN at the two terminals of the second divider resistor 154.

Accordingly, when the comparison signal CMP outputted from the comparing circuit 160 is oscillated between the positive polarity and the negative polarity, the adjusting circuit 170 determines that impedance mismatching occurs between the transmission line driver circuit 100 and the equivalent load circuit 180. In this situation, the adjusting circuit 170 may calibrate the output impedance of the transmission line driver circuit 100 by adjusting the resistance of at least one of the first adjustable resistor 132 and the second adjustable resistor 134 to thereby cause the transmission line driver circuit 100 and the equivalent load circuit 180 to reach the impedance matching condition.

For example, when the comparison signal CMP outputted from the comparing circuit 160 is oscillated between the positive polarity and the negative polarity, the adjusting circuit 170 adjusts the resistance of at least one of the first adjustable resistor 132 and the second adjustable resistor 134 to render the comparison signal CMP outputted from the comparing circuit 160 to stay in either the positive polarity or the negative polarity.

In some embodiments where the comparison signal CMP could only indicate the magnitude relationship between the reference voltage VCM and the divided voltage VPN at the internal node 140, the adjusting circuit 170 may gradually adjust the resistance of the first adjustable resistor 132 or the resistance of the second adjustable resistor 134 in multiple calibration cycles until the comparison signal CMP stays in either the positive polarity or the negative polarity.

In some embodiment where the comparison signal CMP could show both the magnitude relationship between the reference voltage VCM and the divided voltage VPN at the internal node 140 and the difference between the reference voltage VCM and the divided voltage VPN, the adjusting circuit 170 may directly adjust the resistance of the first adjustable resistor 132 to a first target value or directly adjust the resistance of the second adjustable resistor 134 to a second target value in a single calibration cycle to render the comparison signal CMP to stay in either the positive polarity or the negative polarity. For example, a mapping relationship between the resistance adjustment and the difference between the reference voltage VCM and the divided voltage VPN may be represented in the form of a look-up table (not shown) and pre-recorded in the storage circuit of the adjusting circuit 170. In operations, the adjusting circuit 170 may obtain an adequate resistance adjustment from the look-up table according to the difference between the reference voltage VCM and the divided voltage VPN, and then adjust the resistance of at least one of the first adjustable resistor 132 and the second adjustable resistor 134 accordingly.

In can be appreciated from the foregoing descriptions that the comparing circuit 160 in the transmission line driver circuit 100 is capable of detecting whether the transmission line driver circuit 100 and the equivalent load circuit 180 reach the impedance matching condition. If the comparing result of the comparing circuit 160 shows that impedance mismatching occurs between the transmission line driver circuit 100 and the equivalent load circuit 180, the adjusting circuit 170 calibrates the output impedance of the transmission line driver circuit 100 by adjusting the resistance of at least one of the first adjustable resistor 132 and the second adjustable resistor 134. As a result, the impedance mismatching between the transmission line driver circuit 100 and the equivalent load circuit 180 could be adaptively and effectively calibrated, thereby rendering the transmission line driver circuit 100 and the equivalent load circuit 180 to reach the impedance matching condition.

The foregoing operations conducted by the adjusting circuit 170 to adjust the resistance of at least one of the first adjustable resistor 132 and the second adjustable resistor 134 based on the comparing result of the comparing circuit 160 could also mitigate or eliminate the asymmetry in the differential output currents from the first signal node 122 and the second signal node 124. Therefore, the EMI (electromagnetic interference) problems and return loss could be effectively reduced.

In addition, the structure of the aforementioned transmission line driver circuit 100 is applicable to various output circuits, and thus could be applied in many applications.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A transmission line driver circuit for adaptively calibrating impedance matching, comprising:
   a transmission line driving amplifier comprising a first transmission terminal and a second transmission terminal for providing a pair of differential transmission signals;
   a first signal node for coupling with a first load-end signal node of an equivalent load circuit;
   a second signal node for coupling with a second load-end signal node of the equivalent load circuit;
   a first adjustable resistor positioned on a signal path between the first transmission terminal and the first signal node;
   a second adjustable resistor positioned on a signal path between the second transmission terminal and the second signal node;
   an internal node;
   a first divider resistor, wherein a first terminal of the first divider resistor is coupled with a signal path between the first adjustable resistor and the first signal node, and a second terminal of the first divider resistor is coupled with the internal node;
   a second divider resistor, wherein a first terminal of the second divider resistor is coupled with a signal path between the second adjustable resistor and the second signal node, and a second terminal of the second divider resistor is coupled with the internal node;
   a comparing circuit, coupled with the internal node, configured to operably compare a reference voltage with a divided voltage at the internal node to generate a comparison signal; and
   an adjusting circuit, coupled with the first adjustable resistor, the second adjustable resistor, and the comparing circuit, configured to operably adjust resistance of at least one of the first adjustable resistor and the second adjustable resistor according to the comparison signal.

2. The transmission line driver circuit of claim 1, wherein the first signal node and the second signal node are a pair of differential signal nodes of a medium dependent interface (MDI).

3. The transmission line driver circuit of claim 1, wherein the first signal node and the second signal node are a pair of differential signal node of a medium dependent interface crossover (MDIX).

4. The transmission line driver circuit of claim 1, wherein the comparing circuit is a hysteresis comparator.

5. The transmission line driver circuit of claim 1, wherein the reference voltage is a common mode voltage provided by the transmission line driving amplifier.

6. The transmission line driver circuit of claim 5, wherein when the comparison signal is oscillated between a positive polarity and a negative polarity, the adjusting circuit adjusts the resistance of at least one of the first adjustable resistor and the second adjustable resistor to render the comparison signal to stay in either the positive polarity or the negative polarity.

7. The transmission line driver circuit of claim 6, wherein the adjusting circuit gradually adjusts the resistance of the first adjustable resistor or the resistance of the second adjustable resistor in multiple calibration cycles until the comparison signal stays in either the positive polarity or the negative polarity.

8. The transmission line driver circuit of claim 6, wherein the adjusting circuit directly reduces the resistance of the first adjustable resistor to a first target value or directly increases the resistance of the second adjustable resistor to a second target value in a single calibration cycle to render the comparison signal to stay in either the positive polarity or the negative polarity.

* * * * *